United States Patent [19]
Batten, Jr. et al.

[11] Patent Number: 5,981,103
[45] Date of Patent: Nov. 9, 1999

[54] ASSEMBLIES OF ELECTRONIC DEVICES AND FLEXIBLE CONTAINERS THEREFOR

[75] Inventors: L. Eugene Batten, Jr., Angier; Dennis A. McCulloch, Chapel Hill; David H. Williams, Raleigh, all of N.C.

[73] Assignee: Northern Telecom Limited, Montreal, Canada

[21] Appl. No.: 08/989,825

[22] Filed: Dec. 12, 1997

[51] Int. Cl.⁶ ........................................... H01M 2/02
[52] U.S. Cl. .................... 429/163; 429/168; 429/170; 429/172; 429/183; 206/709; 206/720; 361/753; 361/799
[58] Field of Search ..................... 206/706, 707, 206/709, 714, 720, 722; 428/35.8; 429/159, 168, 163, 170, 172, 176, 183; 361/753, 799

[56] References Cited

U.S. PATENT DOCUMENTS

| | | | |
|---|---|---|---|
| 4,478,331 | 10/1984 | Ruin | 206/334 |
| 4,855,873 | 8/1989 | Bhargava et al. | 361/424 |
| 5,545,494 | 8/1996 | Trumble et al. | 429/163 |
| 5,608,611 | 3/1997 | Szudarek et al. | 361/753 |

FOREIGN PATENT DOCUMENTS

| | | | |
|---|---|---|---|
| 287349 A1 | 8/1992 | European Pat. Off. | H01R 13/719 |
| 971008 | 10/1997 | European Pat. Off. | H01R 23/68 |

*Primary Examiner*—Maria Nuzzolillo
*Assistant Examiner*—Voneil Parchment
*Attorney, Agent, or Firm*—Foley & Lardner

[57] ABSTRACT

An assembly of an electronic device within a sealed chamber of a flexible container. The electronic device, which may be a printed circuit board, has signal terminals connected to elongated insulated signal conductors. These conductors pass through a laminate construction wall of the container for connection to outside conductors. The signal conductors are electrically isolated from an EMI protection layer which forms part of the laminate construction wall. A grounding device connects a ground conductor of the electronic device to the EMI protection layer. The grounding device comprises a ground element having teeth on one side. A screwthread arrangement extends through the container wall and clamps the ground element onto the wall with the teeth cutting into the EMI protection layer to be in electrical contact therewith. The ground conductor is electrically connected to the screwthread arrangement.

14 Claims, 6 Drawing Sheets

ASSEMBLIES OF ELECTRONIC DEVICES
AND FLEXIBLE CONTAINERS THEREFOR

This invention relates to electronic devices within flexible containers.

In the electronics industry, electronic devices, e.g. printed circuit boards, are conventionally incorporated into equipment. Depending upon the usage of printed circuit boards particularly, it may be required to prevent electromagnetic radiation from passing to or from electronic components mounted upon the boards because of the electromagnetic interference (EMI) which results. Up to the present time it has been conventional practice to provide EMI shielding around an entire printed circuit board by housing the printed circuit board with a conductive rigid metal shield forming part of an assembly with the printed circuit board. The metal shield is grounded to provide the required EMI protection. An electrical connector is necessary to connect the printed circuit board with electrical equipment or a power source exteriorly of the shield. Conventional arrangements have proved to be unsatisfactorily expensive, occupy an inordinately large spacial volume as compared to the volume of the printed circuit board and its electronic components, and require many manufacturing steps.

In an effort to overcome the above problems, a U.S. Pat. No. 5,545,494 to W. P. Trumble et al, describes an assembly of printed circuit board and a flexible container around the board and in which EMI protection is provided by a conductive flexible metal layer as an inner layer of the container wall. The container has an opening within which a connector of the board is mounted with the opening to the container being sealed around a peripheral surface of the body of the connector. Not only is EMI protection provided, but also the inside of the container and thus the printed circuit board and its electronic components are protected from dust and any other airborne contamination. The problem with the construction described in the above Patent is that the connector body needs to be sufficiently large in size for the container to seal around it at the container opening. A body of this size is much larger than would otherwise be necessary merely to be mounted upon a printed circuit board for conveying signals to and from the board. The structure is therefore cumbersome.

The present invention seeks to provide a solution to the above problems in connecting an electronic device within a flexible container to external electrical means and also to provide an efficient ground for the electrical device.

Accordingly, the present invention provides an assembly of a flexible container and an electronic device comprising: a flexible container defining a chamber and comprising a laminate construction wall which includes a dielectric layer facing inwardly into the chamber and an EMI protection layer surrounding the dielectric layer; an electronic device located within the chamber and having a connector providing a plurality of signal terminals for the device; a plurality of elongate signal terminals each extending from an individual signal terminal of the connector and through the wall for connection to electrical means outside the container, each signal conductor being individually electrically insulated and passing through the wall while being electrically isolated from the EMI protection layer; and a grounding device which electrically connects a ground conductor of the electronic device to the EMI protection layer, the grounding device comprising a ground element having one side provided with outwardly projecting teeth and a screwthread arrangement extending through the laminate construction wall to be disposed partly on the outside of the container and partly inside the chamber, and clamping the ground element onto the laminate construction wall with the projecting teeth cutting into the wall and into electrically conductive contact with the EMI protection layer.

With the above assembly according to the invention, the connector of the electronic device is not mounted within an opening to the container. In contrast, the connector is mounted wholly within the chamber and is connected by the signal terminals through a wall of the container for connection to an outside electrical source. According to an aspect of the invention, the ground terminal of the electronic device is connected to the EMI protection layer by the grounding device as defined. Conveniently the grounding device is connected to the ground of the electronic device by a flexible ground wire which may be electrically connected directly either to the screw-thread arrangement or to the ground element. The ground element may be located within the chamber and clamped against the inside surface of the laminate construction wall. In this case, the flexible ground wire may be connected either to the ground element or to the screwthread arrangement within the chamber. Alternatively, the ground element is provided on the outside of the container in which case the flexible ground wire is connected to the screwthread arrangement within the chamber.

In preferred constructions, the laminate construction wall comprises three layers which include a further dielectric layer surrounding the EMI protection layer. In such an arrangement with the ground element located upon the outside of the container, then the teeth of the ground element cut through the further dielectric layer and cut into the EMI protection layer.

It is also to be preferred that the ground element has two oppositely facing sides provided with projecting teeth. Hence, while teeth on one side cut into the EMI protection layer to provide positive grounding contact, on the other side of the ground element, positive grounding contact is achieved by contact of the teeth with cutting effect into the screwthread arrangement.

In constructions according to the invention, the container may be airtightly sealed or may be provided with apertures for cooling air circulation in which case the apertures should be sufficiently small in cross-section and have spacing such as to prevent electromagnetic radiation from passing through them either into or out of the container. Where the container is airtightly sealed, then a seal is required to seal the grounding device to the container. In this case the seal may form part of the ground device or be separate from it. Conveniently, the ground device is an annular disc through which the screwthread arrangement passes and the disc has the teeth on one side or preferably both sides thereof with the teeth extending around a hole passing through the disc.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

Figure 1:
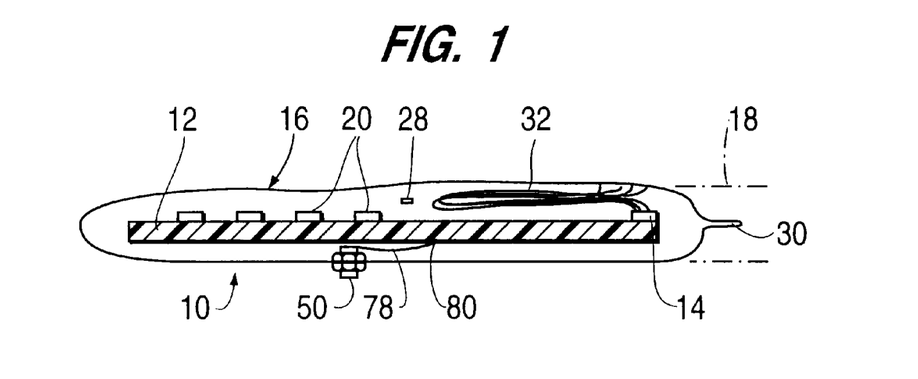
FIG. 1 is a side elevational diagrammatic view in cross-section of an assembly of an electronic device in the form of a printed circuit board disposed within a flexible container and according to a first embodiment.
Figure 2:
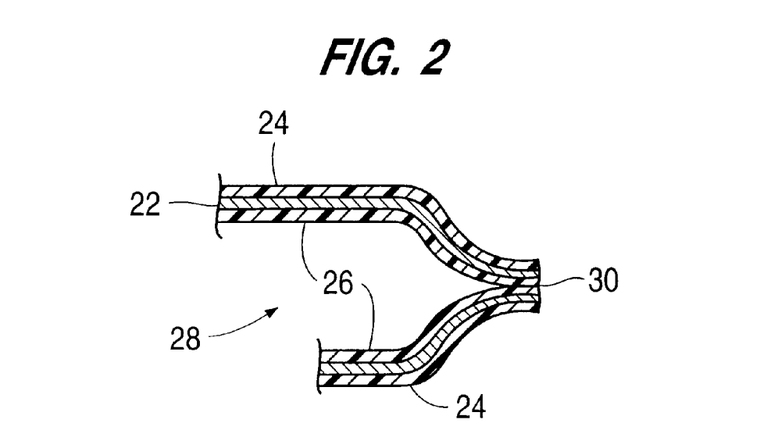
FIG. 2 is a cross-sectional view similar to FIG. 1, but to a larger scale, of part of the assembly of the first embodiment.
Figure 3:
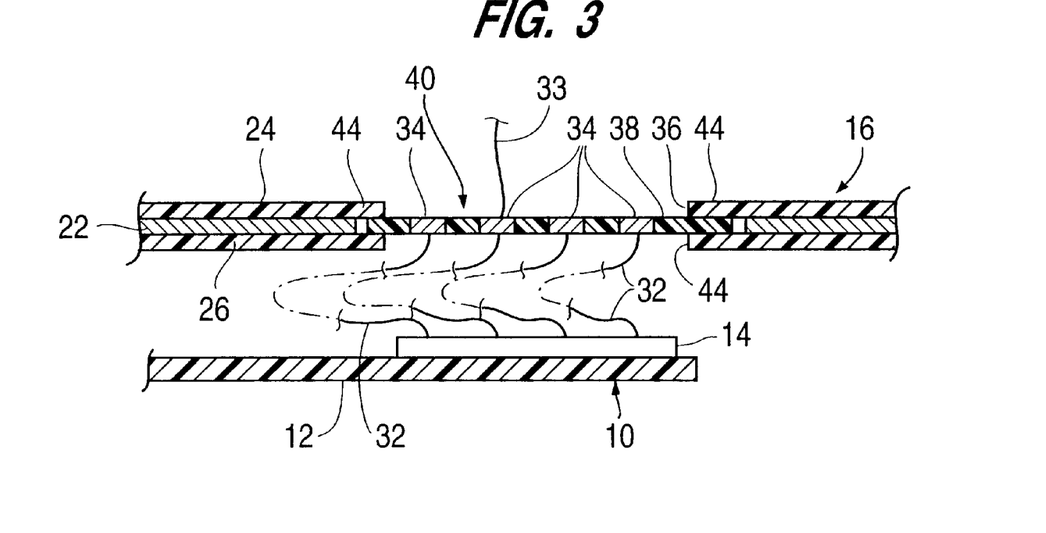
FIGS. 3 and 4 are views similar to FIG. 2 of another part of the assembly of the first embodiment.

In a first embodiment as shown in FIG. 1, an assembly 10 of a printed circuit board and flexible container comprises a printed circuit board 12 of conventional construction, the printed circuit board having an elongate electrical connector 14 connected along one edge region of the board in conventional manner. A flexible container 16 of the assembly is manufactured with an open 18 (shown in chain-dotted in FIG. 1) and into which the printed circuit board 12 and accompanying connector 14 has been inserted as a sub-assembly. The container 16 is of laminate construction wall and requires an EMI protection layer for the purpose of preventing or substantially diminishing the amount of magnetic radiation penetrating the container either to or from electronic components 20 mounted upon the printed circuit board. For this, as shown in FIGS. 2 and 3, a thin metal layer 22 (e.g. copper or other suitable conductive material) is provided intermediate inner and outer layers of the container. The layer 22 may be of any desired thickness while being suitable for its desired purpose. It is found that a thickness down to 0.5 mil will suffice. The layer 22 is also imperforate and thus also serves as a moisture or other fluid barrier through the wall of the container. Alternatively, the layer 22 is perforate while still satisfying its EMI protection requirements and a specific moisture impermeable layer (not shown) is then included in the container. This specific layer may, for instance, be made from polyvinylidene chloride, such as sold under the trade name "Saran™". An outer layer 24 is required to provide strength to the container and also to have abrasion and cutting resistance. In addition, it should also have dielectric properties. Any suitable polymeric material may do for this purpose, e.g. polyethyleneterephthalate, possibly sold under the trade name "Mylar™". Other materials are also suitable including polypropylene or polyamide. The outer layer is of a desired thickness to provide required flexibility. A thickness of at least 1 mil is found suitable.

An inner layer 26 which faces inwardly into a chamber 28 within the container needs also to be of dielectric material. This is basically to prevent shorting of circuitry on the printed circuit board should the container contact any surface of the board or contact any electrical conductor carried by the board. With the particular requirements of the container, it is also necessary for the material of the inner layer to be such that it will fuse and heatseal to itself. A suitable material, and as used in this embodiment, is polyethylene. As shown in FIGS. 1 and 2, marginal edge regions 30 of the container 16 at the opening 18 have been brought together with inside surfaces provided by the polyethylene inner layer 26 abutted and then heatsealed together. An airtight seal along the fused together marginal edge regions 30 is thus provided thereby airtightly sealing the chamber 28 within the container from the outside environment.

The printed circuit board 12 communicates electrically with equipment exteriorly of the container 16 by means of a plurality of individually insulated signal conductors which extend from signal terminals of the connector 14 to present ends facing outwardly from the container for connection to the electrical equipment exteriorly of the container. In this particular embodiment, these individually insulated signal conductors comprise a plurality of individually insulated conductor wires 32 (see FIGS. 1 and 3) which extend from the signal terminals at the connector 14 and are soldered to electrically conductive elements 34 which are carried by the wall of the container as will now be described.

As already indicated, the wall of the container is a laminate construction wall comprising the three layers 22, 24 and 26. However, in this embodiment, the laminate construction wall is formed with an elongated aperture 36 (see FIG. 3) which preferably overlies the position of the connector 14. The aperture 36 is bridged and sealingly closed by a carrier 38 of a preformed assembly 40 of the carrier and the electrically conductive elements 34. The carrier 38 is a single layer of a dielectric material, e.g. polyethylene, polypropylene or polyamide for instance, which may be bonded or heatsealed to either or both of the inner and outer layers 24, 26, of the laminate construction wall. The dielectric material of the carrier 38 holds the electrically conductive elements 34 spaced apart and electrically isolated from each other and, conveniently, these elements are relatively positioned in a pattern which corresponds to the pattern of the terminals in the connector 14 from which the conductor wires 32 extend. Thus, each of the elements 34 has an end facing inwardly into the container 16 which is connected to a corresponding conductor wire 32, and an end which faces outwardly from the container and is exposed for soldering to another insulated conductor wire, e.g. as shown as item 33 in FIG. 3, and which extends to the other electrical equipment. The aperture 36, as shown by FIG. 3, has marginal regions provided by aperture defining dielectric projections 44 of the layers 24 and 26 and which project outwardly beyond the EMI protection layer. The carrier 38 is inserted between the projections 44 and is bonded or heatsealed thereto as required to seal across the aperture.

Figure 4:
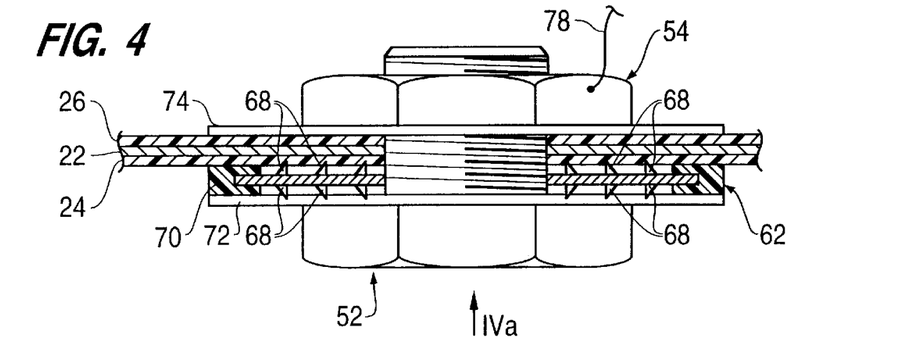
Figure 4A:
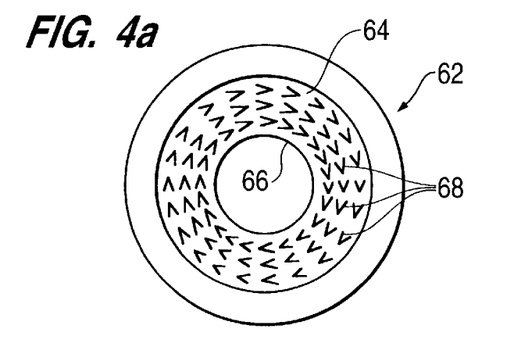
FIG. 4a is a view in the direction of arrow 1Va in FIG. 4 of part of the structure of FIG. 4.
Figure 5:
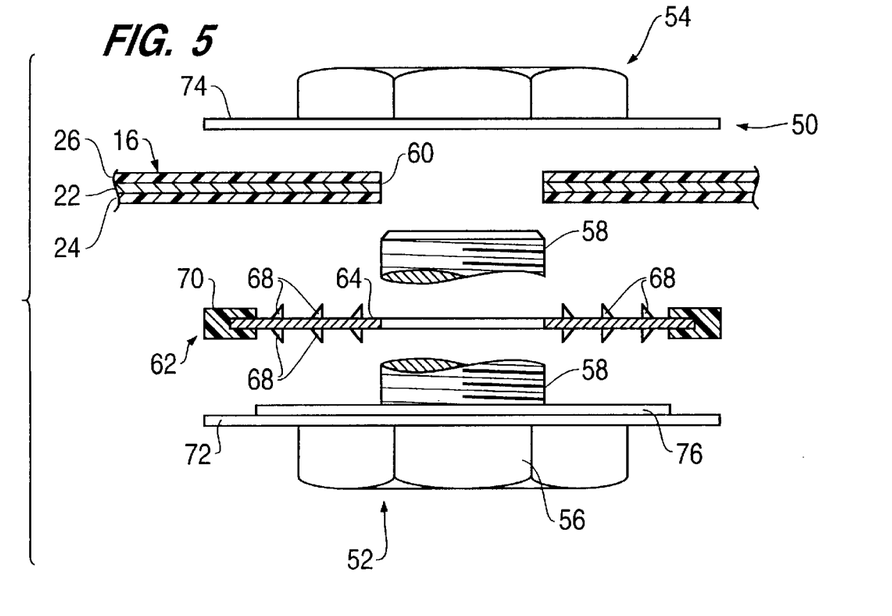
FIG. 5 is an exploded view of the construction of FIG. 4 and to a smaller scale than FIG. 4.

In addition, the first embodiment includes a grounding device 50 for electrically connecting a ground conductor of the printed circuit board to the EMI protection layer 22. As shown in FIGS. 4 and 5, this grounding device 50 comprises a screwthread arrangement comprising a bolt element 52 and a nut element 54, on the opposite side of the printed circuit board 12 from the surface mount components 20. The printed circuit board is designed to be devoid of surface mount components on its side facing, and in the region of, the grounding device 50. This is to prevent shorting of circuitry through the grounding device. A head 56 of the bolt element is positioned outside the laminate construction wall of the container 16 and has a screwthreaded shank 58 extending through a suitably sized aperture 60 in the wall. The shank 58 is screwthreadedly engaged with the nut element 54. The screwthread arrangement holds a ground element 62 to the outside surface of the container. As shown particularly in FIG. 4a, the ground element 62 comprises a flat annular conductive metal disc 64 having a central aperture 66. The disk 64 is formed on both sides with a plurality of axially extending teeth 68 which are pressed outwardly from the plane of the disc. The teeth 68 occupy a radially extending arcuate region of the disc and are also spaced apart around the aperture 66 as shown in FIG. 4*a*. The ground element 62 also includes an annular marginal edge seal 70 which is preformed and attached to the disc 64. The seal 70 is formed of suitable compressible polymeric material and extends slightly axially to each side of the disc 64 as shown in FIG. 5.

The grounding device is secured to the laminate construction wall with the parts relatively located as shown in FIGS. 4 and 5 and with the nut and bolt elements 52 and 54 secured together to clamp the ground element 62 against the container. It is imperative that the teeth 68 on one side of the disc 64 cut through the outer layer 24 of the wall of the container and cut into the EMI protection layer 22 to provide a gas tight connection with the layer 22 for effective grounding purposes. It is also imperative that the seal 70 seals between the bolt element 52 and the outer surface of the container to effectively seal the grounding device in position and ensure that the chamber 28 is fluid tightly sealed from the ambient atmosphere. For these two functions, the bolt element 52 is provided with a radially extending flange 72 and the nut element 54 is provided with a similar flange 74. As will be seen from FIGS. 4 and 5, the flanges 72 and 74 extend radially outwardly beyond the position of the teeth 68 so as to be in axial alignment with the seal 70 thereby enabling the seal 70 and the laminate construction wall to be clamped tightly between them. In addition, the flange 72 may require, as in this embodiment, an axially thicker radially central region 76. This region 76 ensures that direct pressure is applied to the disc 64 by contact between the flange 72 and the disc 64 radially inwardly of the seal 70. This direct pressure ensures that the disc 64 is forced into the laminate construction wall so as to contact and cut into the EMI protection layer 22 while the seal 70 is compressed between the radially outer regions of the flanges 72 and 74. The direct contact between the central region of the flange 72 with the disc 64 also causes the teeth opposing the flange 72 to cut into the flange as pressure is applied by tightening of the screwthread arrangement. This provides a gas tight connection between the flange 72 and the disc 64 for effective grounding purposes. In the finished assembly, the nut and bolt elements 52 and 54 clamp the ground element 62 in position with the teeth 68 cutting, with gas tight contact, into the EMI protection layer 22 and into the flange 72 and with the seal 70 providing an efficient seal to the container wall as discussed above.

To form the assembly of FIG. 1, the grounding device 50 is assembled as shown by FIG. 4 into a suitable position to the laminate construction wall before the assembly 10 of printed circuit board and connector 14 is inserted through the open end 18 of the container. An individually insulated ground wire 78 of indefinite length is soldered at one end to a suitably positioned ground terminal 80, FIG. 1, of the board and the other end of the ground wire passing through the open end 18 of the container is similarly soldered to the screwthread arrangement.

The conductive elements 34 of the assembly 40 are electrically connected to the signal terminals of the connector 14 by the conductor wires 32 before the assembly 40 is sealed across the aperture 36 and also before the assembly 20 is located in the chamber 28. The assembly 40 is similar in construction to one of the constructions described in co-pending U.S. patent application Ser. No.(Applicants' reference Ser. No. 08/989,719) and the contents of the co-pending Patent Application are included in this patent application by reference. As referred to in the above-mentioned co-pending Patent application, after the conductive elements 34 are electrically connected to the signal terminals of the connector 14, then the carrier 38 is located across the aperture 36 and is heatsealed or bonded into the position shown in FIG. 3 of this application and the assembly 10 is then inserted through the open end 18 and into the chamber 28. Also as described in the co-pending above-mentioned patent application, the open end 18 is then formed into the closed end 30, (FIG. 2) by a heatsealing operation which heat seals the confronting surfaces of the inner layer 26 together at the end.

As may be seen from the first embodiment, the assembly 10 is located within the chamber 28 and electrical signals may be passed from the connector 14 to electrical conductors exteriorly of the laminate construction wall. This avoids the requirement for an oversize connector to be mounted within the opening to a container which is sealed around the connector. In addition to this, and of primary importance to this present invention, the grounding device provides an effective and simple construction for grounding the printed circuit board to the EMI protection layer 22 of the container. Hence, the ground requirements are considered separately from the requirements of conveying signals outwardly from the container and allow for greater flexibility in signal path location and design than if ground conductors were included in a group with the signal conductors.

Figure 6:
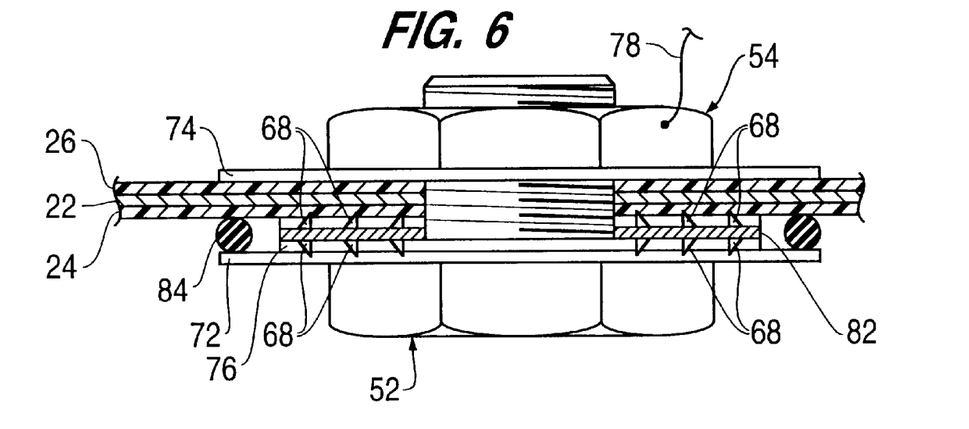
FIGS. 6 and 7 are views similar to FIG. 4 of second and third embodiments, respectively.

In a second embodiment as shown by FIG. 6, an assembly of container and electrical device is basically similar to that described in the first embodiment. The second embodiment differs from the first embodiment however, in that with the grounding device, a seal is not provided as part of the ground element. As shown in the second embodiment, the ground element consists of a flat annular disc 82 having teeth 68 as described for the disc 64 in the first embodiment. The disc 82 is clamped between the bolt and nut elements 52 and 54 as described in the first embodiment with a shoulder 76 directly forcing the disc 82 against the outside surface of the container. The disc 82 lies radially within a separate annular compressible elastomeric seal 84 which is radially spaced from the disc 82 and is compressed against the outside surface of the container by the flange 72.

Figure 7:
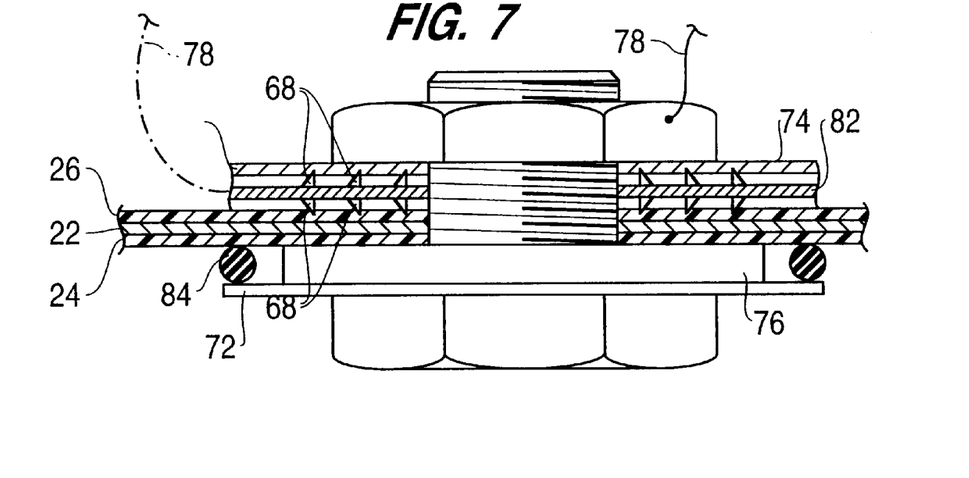

In a third embodiment which is basically similar again to the first embodiment, and as shown by FIG. 7, a ground element is disposed on the inside of the container, i.e. within the chamber 28, as distinct from outside the container as in the previous embodiment. In the case of the third embodiment, a ground element 82 is again employed as described with reference to the second embodiment. This ground element is a flat annular disc 82 which is held against the inside surface of the container, i.e. against the inner layer 26, with the teeth 68 projecting through the layer 26 and cutting into the EMI protection layer 22. The disc 82 is clamped against the container wall with the flange 74 in engagement with the disc. In this construction, the ground wire 78 may either be soldered to the screwthread arrangement as shown in FIG. 7 or alternatively, as shown in chaindotted line in FIG. 7, may be connected directly to the disc 82. On the outside of the container, a compressible seal 84 is again employed to seal between the flange 72 and the outside surface of the container. The axially thicker radially central region 76 of the flange 72 may be again required to provide positive clamping pressure to the disc 82.

In the first, second and third embodiments, a ground wire was necessary to connect the screwthread arrangement with the ground conductor of the printed circuit board. A ground conductor is not necessary in certain constructions and as will now be described, by way of example, in a fourth and fifth embodiments.

Figure 8:
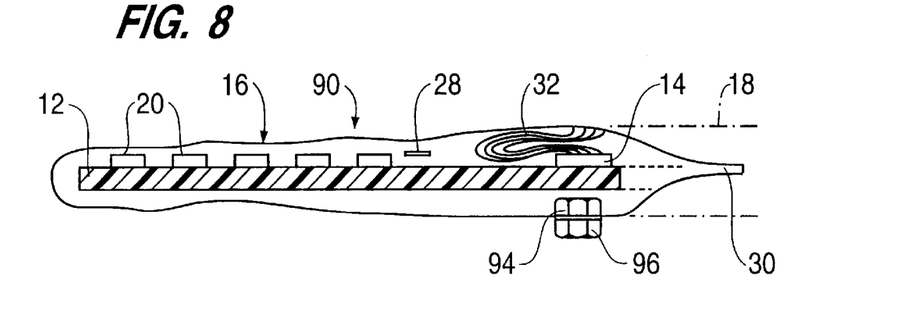
FIG. 8 is a view similar to FIG. 1 of a fourth embodiment.
Figure 9:
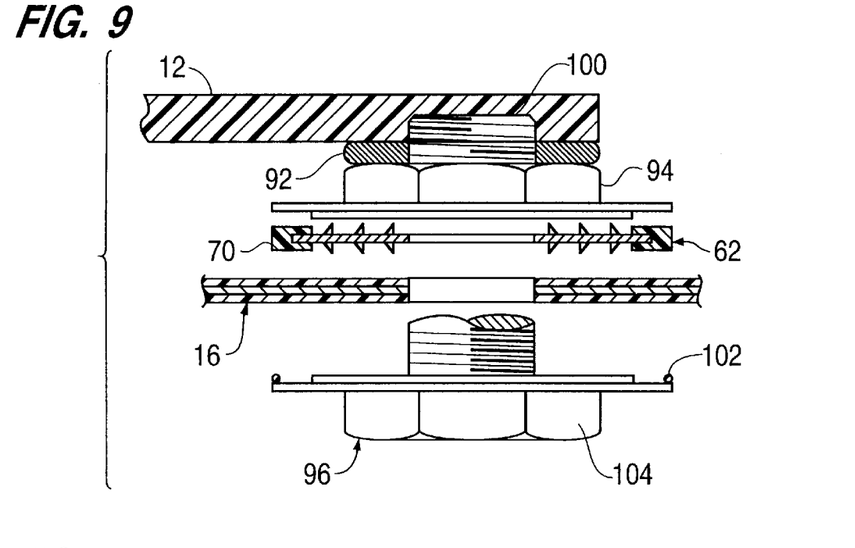
FIGS. 9 and 10 are exploded and assembled cross-sectional views respectively of part of the construction of the fourth embodiment and to a larger scale than FIG. 8.
Figure 10:
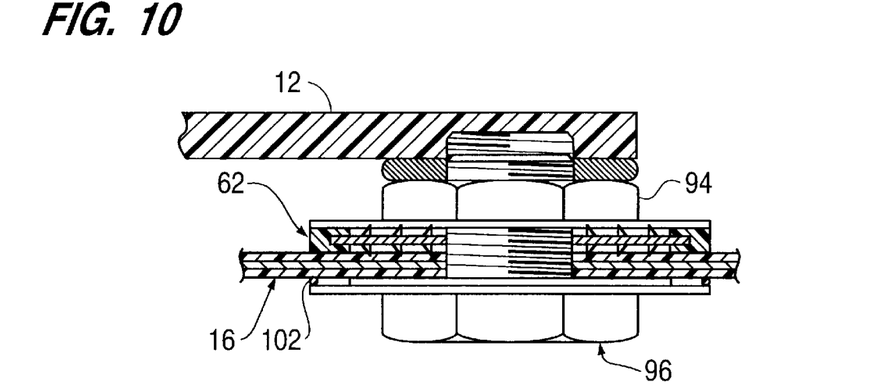

In the fourth embodiment, with reference to FIGS. 8, 9 and 10, the printed circuit board 12 in an assembly of a container and electrical device 90 has a ground conductor 92 on the side of the board devoid of surface mount components. The screwthread arrangement of the grounding device comprises a nut element 94 which is secured to the printed circuit board 12 by being soldered for electrical connection to the ground conductor 92. The other part of the grounding device comprises a bolt element 96 positioned on the outside of the container 16 for reception through an aperture 98 in the container and into screwthreaded engagement with the nut element 94. To allow for the bolt to pass completely through the nut element 94, a bore 100 extends through the printed circuit board and axially in line with the screwthreaded hole in the nut element 94. The ground element 62 of the construction described in the first embodiment, is positioned in the assembly (FIG. 10) between the nut element 94 and the container 16 so as to be clamped against the inside of the container wall with the bolt tightened into the nut element. In this construction, while the annular seal 70 of the ground element should suffice to seal between the nut element and the inside surface of the container wall, it may be necessary to also employ a further annular seal 102 on the outside of the container and compressed under the head 104 of the bolt element 96.

With the nut element 94 disposed towards the end of the printed circuit board nearest to the open end 18 of the container 16, then during assembly, it is a simple matter to assemble the bolt element 96 into position through the container wall and into the nut element for grounding purposes through the open end and before forming the closed end 30.

Figure 11:
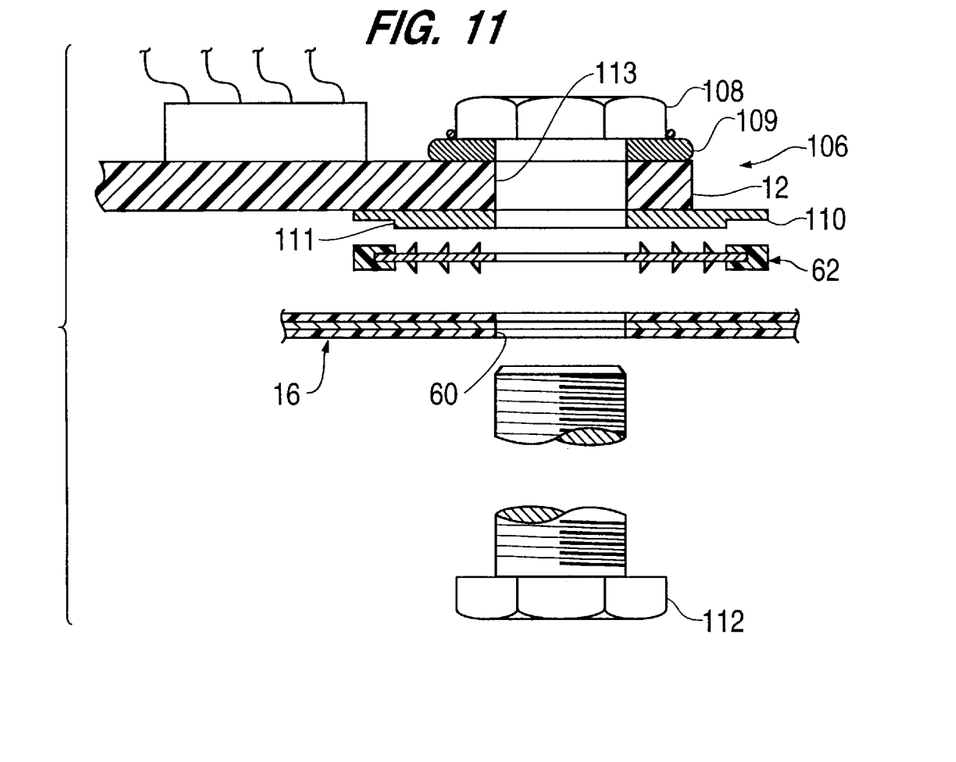
FIG. 11 is a view similar to FIG. 3 and showing one manner of grounding an EMI protection layer of the flexible container according to any of the first to fourth embodiments.

In the fifth embodiment, as shown in exploded view in FIG. 11 in a grounding device 106, a nut element 108 is secured to the printed circuit board by being soldered for electrical connection to a ground conductor 109 similarly to that described in the fourth embodiment, but with one minor difference. This is that the nut element 108 and ground conductor 109 are disposed on the side of the printed circuit board 12 remote from a bolt element 112. In this case, as shown by FIG. 11, instead of the nut element being formed with a flange as flange 74 in other embodiments, a separate washer member 110 is disposed against the printed circuit board on the other side of the board from the nut element 108. This washer element has a thicker radially central region 111 for applying clamping pressure directly to the flat annular conductive metal disc 64 of the ground element 62. The ground element 62 is disposed between the washer element 110 and the container 16. In the assembled condition of the construction of the fifth embodiment, the bolt element 112 having its own flange 72 similar to the construction in FIG. 5, has its shank extending through the aperture 60 in the container 16. The shank then continues though the ground element 62 and through the washer element 110 and axially aligned hole 113 in the printed circuit board for reception through the nut element 108.

An advantage with the fifth embodiment is that when assembled together, the bolt element 112 tightened onto the nut element 108, places the ground conductor 109, printed circuit board 12, washer element 110 and ground element 62 in axial compression together with the container 16. Thus, the solder which holds the nut element 108 to the ground conductor 109 is not relied upon to retain the nut element in position.

Figure 12:
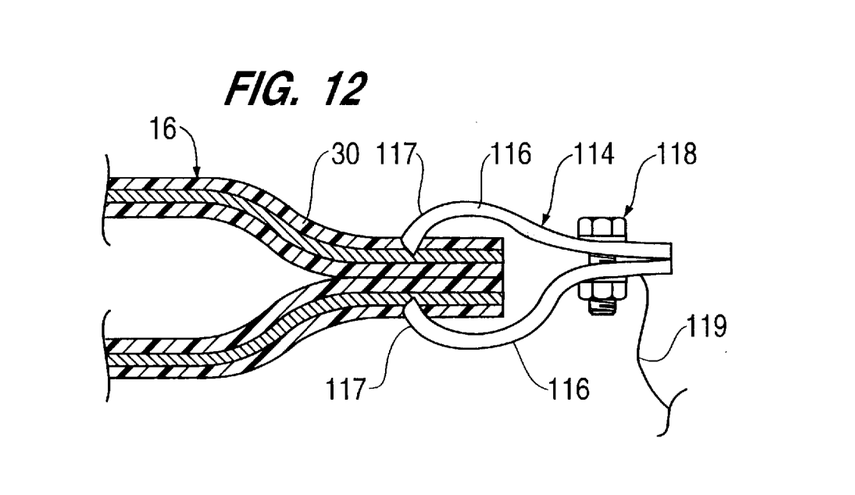
FIG. 12 is an exploded cross-sectional view of part of the construction of a fifth embodiment and to the scale of FIG. 9.

In any of the above embodiments one to five, any desired method of grounding the EMI protection layer 22 may be employed when the assembly of printed circuit board and container is in a position of use. In one method of providing a ground for the EMI protection layer 22, FIG. 12, a jaw clamp 114 is clamped onto the closed end 30 of the container, the jaw clamp having two opposing jaws 116 each provided with cutting teeth 117. A clamping nut and bolt assembly 118 draws the jaws into a clamping position so that the teeth at each side pass into the closed end 30 of the container and through the EMI protection layer 22 to form a gastight electrical connection with that layer. The jaw clamp 114 is then connected by a ground wire 119 to ground.

The above described embodiments have been discussed with reference to the use of the carrier 38 having the conductive elements 34 for conveying electrical signals through the laminate construction wall to and from the printed circuit board. However, other constructions for effectively conveying signals through the wall may also be used. Such constructions are described in the co-pending U.S. patent application referred to above (Applicants' reference Ser. No. 08/989,719). For instance, in modifications of any of the above three described embodiments, constructions for passing signals through the laminate construction wall may be as follows.

Figure 13:
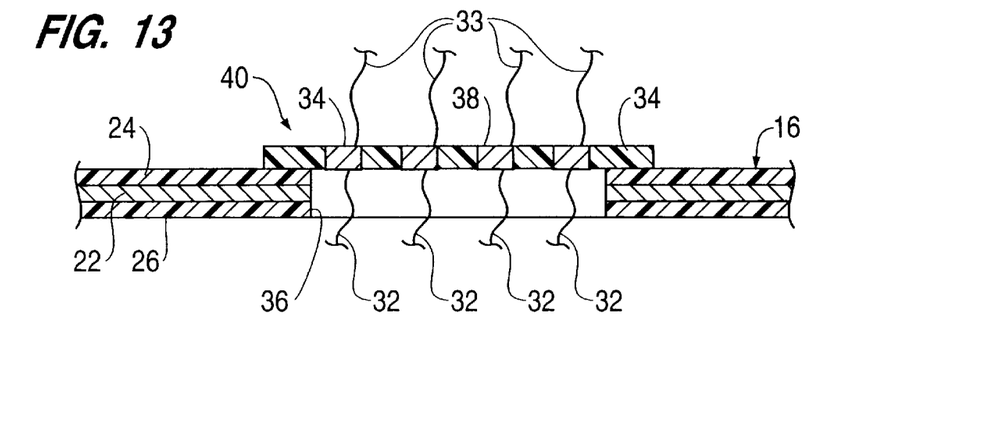
FIGS. 13, 14 and 15 are modifications to any of the first to fourth embodiments.

In a first modification of any of the above embodiments, and as shown by FIG. 13, the carrier 38 is bonded to the outside surface of the container 16, i.e. the outside surface of the layer 24, and the aperture 36 may be of the same size and dimensions right through the laminate construction wall without the projections 44 being provided.

Figure 14:
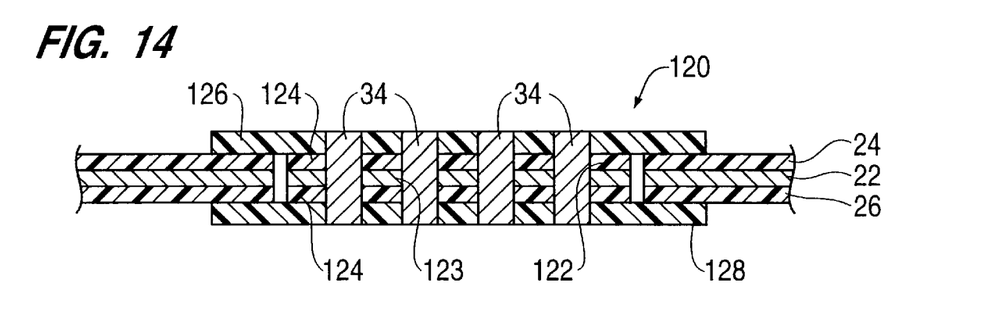

In a second modification as shown by FIG. 14, a carrier 120 comprises an EMI protection layer 122 which may be of the same material of the layer 22 and of a similar thickness. On either side of the EMI protection layer 122 is provided a dielectric layer 124 of any suitable polymeric material. Each layer is of suitable size and shape to fit within the aperture 36. An outer layer 126 which projects from the layer 124 in all radial directions, overlaps the marginal regions of the aperture provided by layer 24 and is bonded to the layer 24. The layer 126 may be of the same material as the layer 24. An inner layer 128 of similar dimensions to the layer 126 overlaps the inner layer 26. The layer 128 is conveniently of the same material as the layer 26 and is heatsealed thereto. As may be seen from the construction of the third embodiment, the EMI protection layer 122 would prevent EMI radiation from the area provided by the aperture 36 with the carrier 120 in position in the finished assembly. The EMI protection layer 122 has clearance holes 123 for spacing from the conductive elements 34 and dielectric polymeric material lying within the clearance holes electrically isolates the elements 34 from the layer 122.

Figure 15:
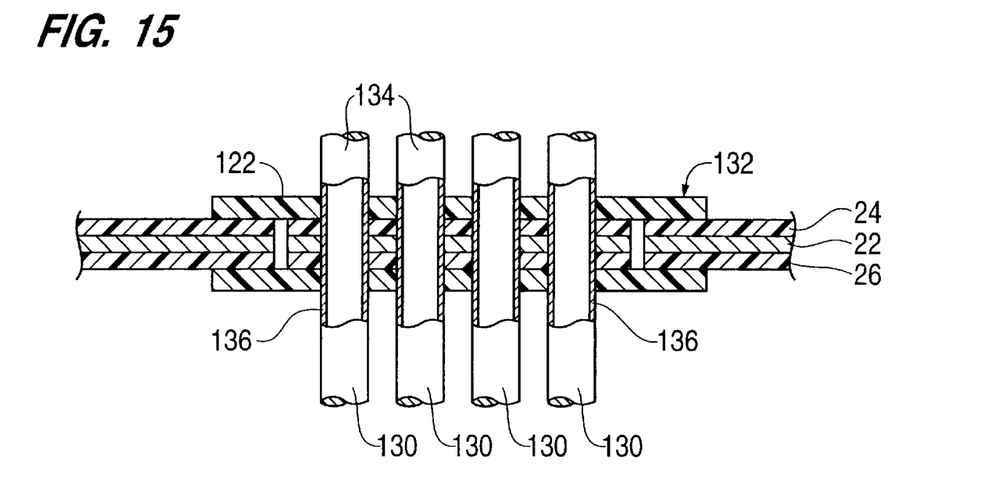

In a third modification as shown by FIG. 15, electrical signals are conveyed to and from the printed circuit board 12 by individually electrically insulated conductor wires 130 which pass from the board 12 through the chamber 28 and out to the outside environment. These wires 130 pass through a carrier 132 which is molded around the wires so that end regions 134 of the conductor wires project exteriorly of the container in the finished assembly for connection to other electrical equipment. As also shown by FIG. 14, the carrier 132 may be of basically the same construction as the carrier 120 in the second modification described above, but, in the third modification, the EMI protection layer 122 is separated from each of the conductor wires 130 by an insulation layer 136 on each of the wires.

What is claimed is:

1. An assembly of a flexible container and an electronic device comprising:

a flexible container defining a chamber and comprising a laminate construction wall which includes a dielectric layer facing inwardly into the chamber and an EMI protection layer surrounding the dielectric layer;

an electronic device located within the chamber and having a plurality of signal terminals for the device;

a plurality of elongated signal conductors electrically isolated from one another with each signal conductor electrically connected to an individual signal terminal of the device and extending out from the chamber for connection to electrical means outside the container, each signal conductor passing through the wall while being electrically isolated from the EMI protection layer; and a grounding device which electrically connects a ground conductor of the electronic device to the EMI protection layer, the grounding device comprising a ground element having one side provided with outwardly projecting teeth and a screwthread arrangement extending through the laminate construction wall to be disposed partly on the outside of the container and partly inside the chamber, the ground element being clamped by the screwthread arrangement onto the laminate construction wall with the projecting teeth cutting into the wall and into electrically conductive contact with the EMI protection layer.

2. An assembly according to claim 1 wherein the ground element has another side provided with outwardly projecting teeth which are in electrically conductive contact with the screwthread arrangement.

3. An assembly according to claim 2 wherein the laminate construction wall comprises three layers which include a further dielectric layer surrounding the EMI protection layer and the ground element is clamped against the outside of the container with the teeth cutting through the further dielectric layer and cutting into the EMI protection layer.

4. An assembly according to claim 2 wherein part of the screwthread arrangement is mounted upon the electronic device and is secured to the ground conductor of the printed circuit board for electrical conduction purposes.

5. An assembly according to claim 4 wherein the part of the screwthread arrangement mounted upon the electronic device comprises a nut element.

6. An assembly according to claim 5 wherein the screwthread arrangement also comprises a bolt element which comprises a head disposed exteriorly of the laminate construction wall with a shank extending through the laminate construction wall, through the grounding device and through the printed circuit board to be received by the nut element, the printed circuit board, grounding device and laminate construction wall being axially compressed between the nut element and bolt element.

7. An assembly according to claim 3 wherein the ground device is electrically connected to the ground conductor of the electronic device by means of a ground wire electrically connected to the screwthread arrangement on the inside of the chamber.

8. An assembly according to claim 2 wherein the ground element is within the chamber and is clamped against the dielectric layer facing inwardly into the chamber.

9. An assembly according to claim 8 wherein the ground device is electrically connected to the ground conductor of the electronic device by means of a ground wire electrically connected to the ground element.

10. An assembly according to claim 8 wherein the ground device is electrically connected to the ground conductor of the electronic device by means of a ground wire electrically connected to the screwthread arrangement on the inside of the chamber.

11. An assembly according to claim 2 wherein the ground element is an annular disc having the teeth on both sides of the disc, the screwthread arrangement extending through the disc and clamping the disc on to the laminate construction wall.

12. An assembly according to claim 11 wherein the chamber is airtightly sealed and a seal is also clamped between the screwthread arrangement and the laminate construction wall.

13. An assembly according to claim 12 wherein the seal and the disc provide an integral unit with part of the seal extending axially on each side of the disc.

14. An assembly according to claim 12 wherein the seal is separate from and is positioned radially outwards of and surrounds the disc.

* * * * *